United States Patent [19]
Shannon et al.
[11] 3,865,633
[45] Feb. 11, 1975

[54] METHODS OF MANUFACTURING SEMICONDUCTOR BODIES

[75] Inventors: John Martin Shannon; John Anthony Kerr, both of Salfords, near Redhill, England

[73] Assignee: U.S. Philips Corp., Briarcliff Manor, N.Y.

[22] Filed: Jan. 17, 1973

[21] Appl. No.: 324,357

[30] Foreign Application Priority Data

Jan. 31, 1972 Great Britain .......... 4513/72

[52] U.S. Cl. .......... 148/1.5, 148/188, 357/91
[51] Int. Cl. .......... H01l 7/54
[58] Field of Search .......... 148/1.5, 188; 317/234

[56] References Cited

UNITED STATES PATENTS

| | | | |
|---|---|---|---|
| 3,383,567 | 5/1968 | King et al. | 317/234 |
| 3,515,956 | 6/1970 | Martin et al. | 317/234 |
| 3,718,502 | 2/1973 | Gibbons | 148/188 X |
| 3,756,862 | 9/1973 | Ahn et al. | 148/1.5 |
| 3,761,319 | 9/1973 | Shannon | 148/1.5 |

OTHER PUBLICATIONS

"Microelectronics," Keonjian, Ed., McGraw-Hill, N.Y., pp. 285-286.

*Primary Examiner*—L. Dewayne Rutledge
*Assistant Examiner*—J. M. Davis
*Attorney, Agent, or Firm*—Frank R. Trifari; Jack Oisher

[57] ABSTRACT

In order to provide a semiconductor surface layer of desired properties at a substantially constant depth from all parts of the surface, the body is subjected to bombardment with a beam of energetic particles so as to cause internal crystal damage in the layer over a controlled distance while the semiconductor is maintained at an elevated temperature causing enhanced diffusion of substrate impurities into the layer along the boundary of the damaged zone.

7 Claims, 5 Drawing Figures

METHODS OF MANUFACTURING SEMICONDUCTOR BODIES

This invention relates to a method of manufacturing a semiconductor body comprising a semiconductor surface layer on a more highly doped semiconductor substrate or substrate part, said surface layer having a substantially constant depth in the body.

In the manufacture of a semiconductor device from such a semiconductor body it is a common requirement that the depth from the surface of the layer of the boundary with a region of different doping is substantially constant. For example when the surface layer is an epitaxial layer of substantially uniform doping provided on a more highly doped substrate or substrate part, it is a common requirement that the thickness of the epitaxial layer is constant over the whole area of the substrate in the form of a semiconductor slice. This is because if a variation in the thickness of the epitaxial layer occurs, then in a plurality of devices produced from the semiconductor body comprising the substrate slice and applied epitaxial layer there will be a variation in the characteristics of the devices and in some cases the variation in thickness in a single large area device may lead to very poor characteristics. Epitaxial layer thickness control is important, for example in the manufacture of junction field effect transistors as the pinch-off voltage inter alia is related to this parameter, and in some varactor diodes where the minimum capacitance is related to the epitaxial layer thickness. Furthermore epitaxial layer thickness control is important, not only in the individual slice, but also in a plurality of slices which are subjected to epitaxial deposition by substantially similar processing means, for example simultaneously in the same apparatus or in batches in the same or similar epitaxial deposition apparatus.

In some manufacture it is desired to form very thin epitaxial layers, for example of less than 3 microns thickness. Hitherto it has been found very difficult to obtain such thin layers with a constant thickness and this has rendered the formation of devices having an epitaxial layer thickness of 1 micron or less extremely difficult.

In a co-pending Patent application, now U.S. Pat. No. 3,761,319, there is described and claimed a method of manufacturing a semiconductor device wherein a semiconductor body comprising a boundary between a higher doped region and a lower doped region is subjected to bombardment with a beam of energetic particles — which are directed towards the boundary from the side thereof at which the lower doped region is present, the bombardment being effected to cause internal damage of the crystal structure in the vicinity of the boundary, and the semiconductor body being maintained at an elevated temperature during said bombardment to produce an enhanced diffusion of impurity across the boundary from the higher doped region into areas of the lower doped region affected by the damage created by the energetic particles.

The present invention is based on the recognition that by suitable control of the conditions of bombardment said method can be employed advantageously where it is desired to form a semiconductor surface layer having a substantially constant depth from all parts of the surface, particularly, but not exclusively, where said surface layer is an epitaxial layer of substantially uniform doping which is required to have a substantially constant thickness.

According to the invention there is provided a method of manufacturing a semiconductor body wherein a semiconductor layer is applied on a semiconductor substrate or substrate part which is more highly doped than the layer and subsequently the semiconductor body is subjected to bombardment with a beam of energetic particles which are incident at or adjacent the surface of the layer and are directed towards the boundary between the layer and the substrate, the bombardment being effected to cause internal damage of the crystal structure in the layer adjacent the boundary over a controlled distance which extends between the vicinity of the boundary and a substantially constant depth from all parts of the surface of the layer, and the semiconductor body is maintained at a suitable temperature during said bombardment to produce an enhanced diffusion of substrate impurity into the layer and to re-locate the boundary between the layer material and the underlying more highly doped region comprising substrate impurity at positions in the layer which are at a substantially constant depth from all parts of the layer surface.

In this method provided the bombarding energetic particles and their energy are appropriately chosen such that (a) sufficient damage is created in the layer close to all parts of the boundary, and (b) the damage distribution is such that the damage concentration decreases sharply on the surface side, any pre-existing irregularities in the thickness of the surface layer are automatically compensated for by the enhanced diffusion of substrate impurity because the bombarding energetic particles which are incident at or adjacent the layer surface have the same range distribution for all parts of the surface and it is this range distribution which is effective in determining the re-location of the boundary at a substantially constant depth from all parts of the layer surface. If before the bombardment the boundary is at a variable depth from the layer surface due to the layer having a non-uniform thickness then provided such thickness variation is within certain limits determined by the damage distribution, subsequent to carrying out the bombardment the boundary will be located in the layer substantially parallel to the layer surface.

The energy of the bombarding particles preferably is chosen such that the mean range of the particles in the material of the semiconductor layer substantially coincides with the average thickness of the layer. However in some circumstances as will be described hereinafter the mean range of the particles may be slightly less than the average thickness of the layer.

In one preferred form of the method the semiconductor layer is an epitaxial layer which is applied on a substantially flat surface of a more highly doped semiconductor substrate or substrate part. The layer may be of the same conductivity type as the substrate or of the opposite conductivity type to the substrate and preferably is provided having a substantially uniform impurity doping throughout its thickness. In this form of the method the said boundary prior to the bombardment normally lies at or very close to the metallurgical interface between the epitaxial layer and substrate, in some instances it lying further in the epitaxial layer due to greater diffusion of substrate impurity into the layer during the epitaxial deposition process. By the method in accordance with the invention the boundary is re-located in the epitaxial layer away from the metallurgical interface and at a substantially constant depth from the surface of the epitaxial layer. Although when the layer and substrate or substrate part are of the same conductivity type the identification of an abrupt boundary between the layer material and the underlying more highly doped region comprising substrate impurity is not possible, for the purpose of the present specification the boundary is deemed to be present at those positions in the layer where the conductivity type determining impurity concentration is increased by a factor of 10 due to diffusion from the substrate or substrate part. When the layer and the substrate or substrate part are of opposite conductivity types the boundary is considered to be at the location of the p-n junction.

The bombardment may be effected on individual semiconductor bodies comprising a substrate or substrate part having an epitaxial layer thereon, for example when such a body is to be further processed to form a plurality of semiconductor devices. However in a modification of the method in accordance with the invention a plurality of semiconductor substrates are each provided with an epitaxial layer of substantially uniform doping by substantially similar processing means and thereafter at least some of said plurality of semiconductor bodies with applied epitaxial layers are subjected to the said bombardment with energetic particles to produce a plurality of semiconductor bodies in which in the epitaxial layers the boundaries between the layer material of substantially uniform doping and the underlying more highly doped region comprising substrate impurity are all situated at substantially the same constant depth from the epitaxial layer surface. This use of the method is particularly advantageous where a large plurality of semiconductor slices are treated simultaneously in the same epitaxial reactor and a variation occurs in the epitaxial layer thickness on the slices. For example such thickness variation may occur for the slices situated both longitudinally and laterally along the susceptor body in the epitaxial reactor. By the use of the bombardment induced radiation enhanced diffusion treatment in accordance with the invention uniformity of the plurality of the composite semiconductor bodies may be provided in the sense that the depth of the boundaries in the epitaxial layers are all substantially the same constant value. Hence some epitaxially deposited slices which hitherto may have had to be rejected because of too great a thickness variation now become useable.

Concerning the nature of the energetic particles used for the bombardment, it is a general requirement that such particles of a given energy provide a damage distribution in the semiconductor material of the layer with a steep decrease in concentration on the surface side. The damage distribution resulting from implantation of ions can be represented approximately by a Gaussian distribution and is suitable for this technique. Protons in particular are suitable for this purpose and other light ions, for example helium or neon may also be used. Depending on the nature of the semiconductor material the semiconductor body may have to be heated during the bombardment to produce the enhanced diffusion. Thus when the semiconductor substrate or substrate part and the layer are of silicon and the energetic particles are protons the semiconductor body may be heated to a temperature in the range of 500°C to 900°C during the bombardment.

Embodiments of the invention will now be described, by way of example, with refrence to the accompanying diagrammatic drawings, in which.

Figure 4:
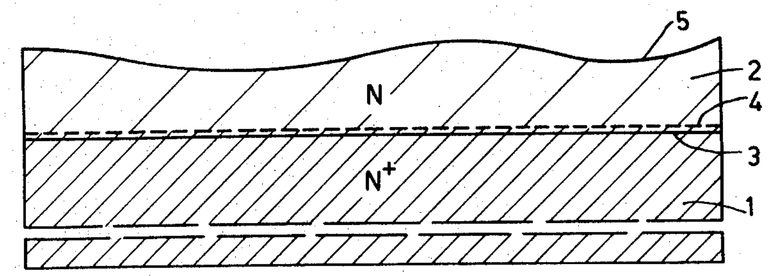
Figure 5:
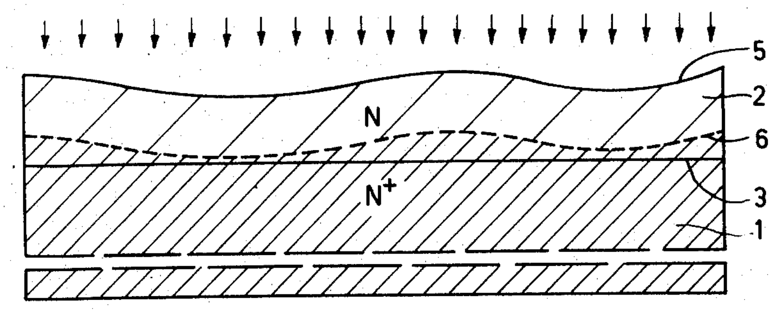
Figure 3:
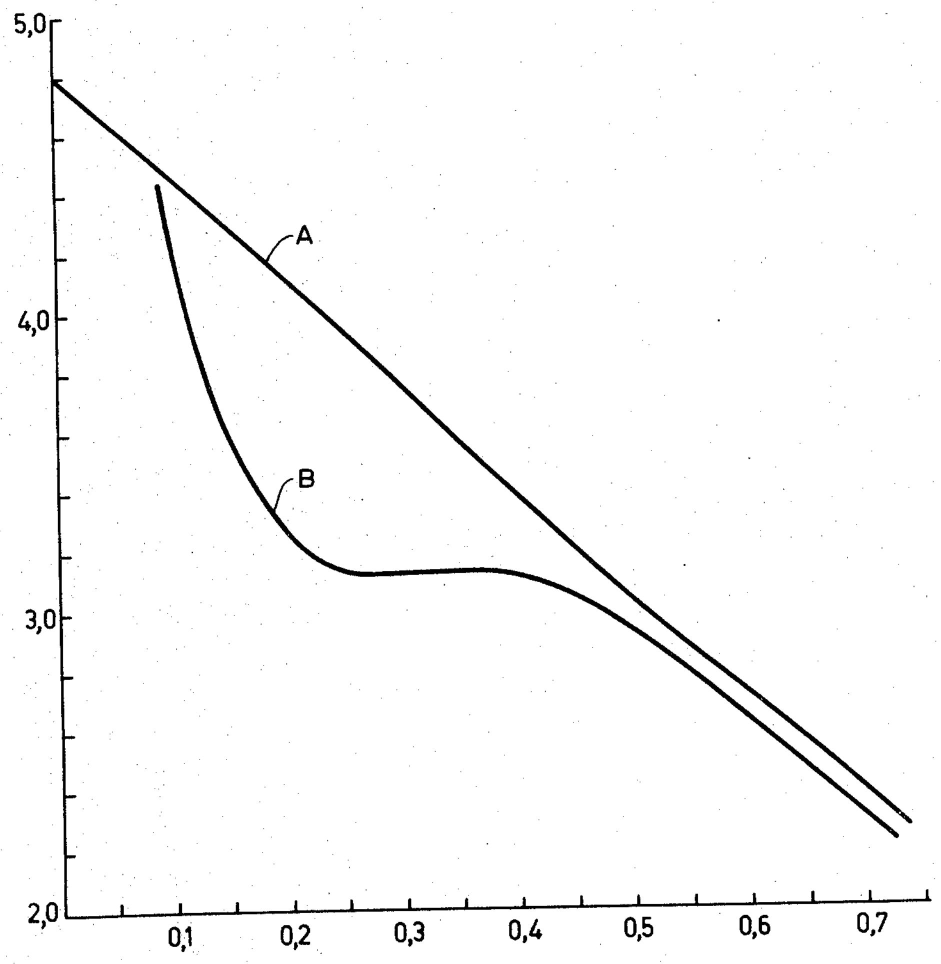

FIG. 3 is a graph showing for an etched bevelled silicon body comprising an *n*-type epitaxial layer on an $n^+$ substrate, the positions of the boundary between the layer and the substrate prior and subsequent to a proton bombardment step; and FIGS. 4 and 5 are cross-sectional views of a semiconductor body in the form of a semiconductor substrate having an applied epitaxial layer at successive stages in a method of manufacturing a semiconductor body by a first embodiment of the method in accordance with the invention.

Figure 1:
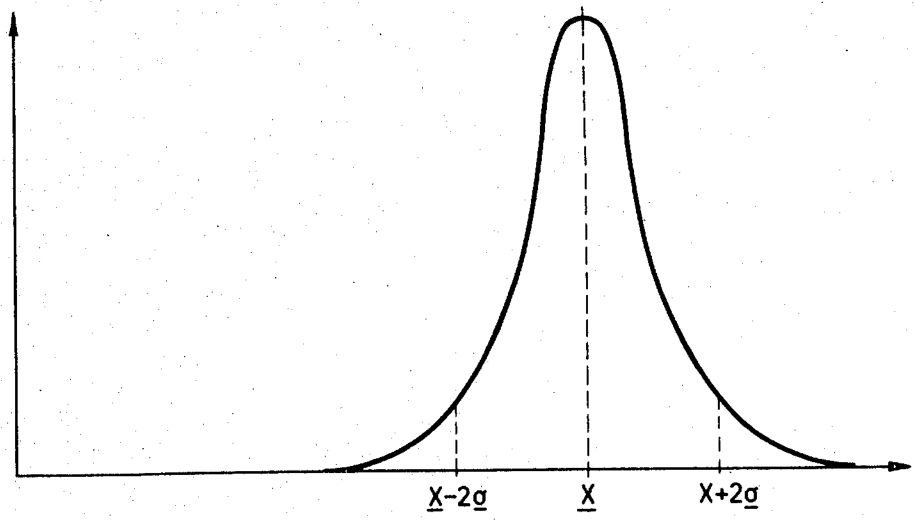
FIG. 1 is a graph showing for a semiconductor body of silicon the approximate proton density as a function of depth produced by bombardment of the silicon surface with protons.

Referring first to FIG. 1, this shows for a silicon body when bombarded with protons a plot of proton density as ordinate against depth from the silicon surface as abscissa. This proton distribution approximates to the damage density and is Gaussian of standard deviation $\sigma$. The damage density falls to one tenth of its maximum value in a distance of two standard deviations. Considering first the case where the maximum damage occurs at a distance $x$ from the surface and this corresponds with the mean position of a boundary between a more highly doped silicon substrate and a varying thickness less highly doped surface epitaxial layer in which initially the mean depth of the boundary is equal to $x$ and assuming that the epitaxial layer thickness variation is such that initially the depth variation of the boundary about the mean value $x$ is $\pm 2\sigma$. As the boundary over the whole area of the body lies at a depth between $x - 2\sigma$ and $x + 2\sigma$ and it is within this depth range that substantial damage occurs, the effect of the enhanced diffusion of impurity from the more highly doped substrate into the damage sites is to shift the boundary towards the surface and re-locate it at all positions at a depth approximating to $x - 2\sigma$ from the surface. Thus the boundary which previously was at a varying depth from different parts of the surface is re-located at a substantially constant depth from all parts of the surface. If the initial thickness variation of the epitaxial layer is such that the variation of the boundary depth about mean value $x$ is greater than $\pm 2\sigma$ then the enhanced diffusion effect and consequent re-location of the boundary will be less pronounced but if such variation is not significantly greater than $\pm 2\sigma$ then the depth of the re-located boundary will approach uniformity.

Figure 2:
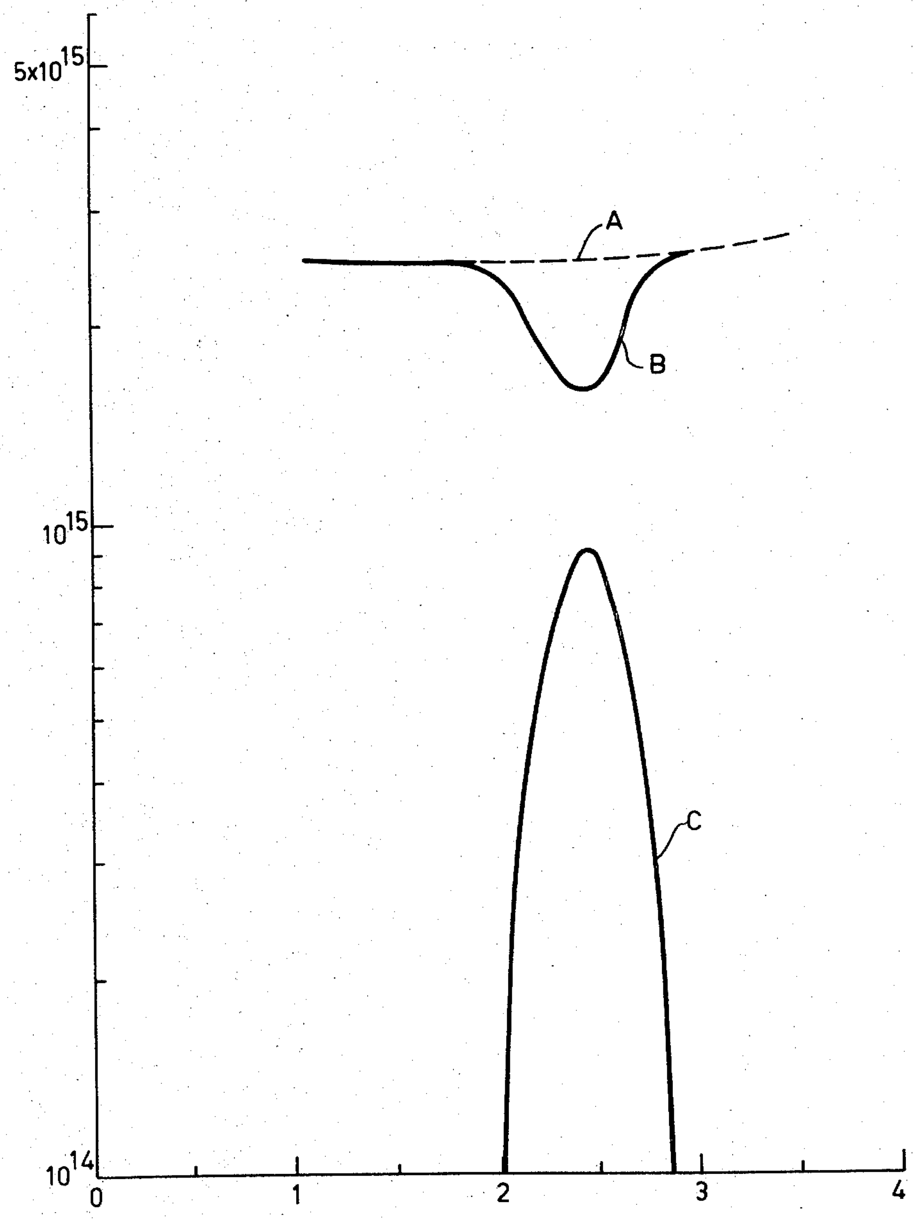
FIG. 2 is a graph showing for a silver contaminated silicon layer the carrier concentration as a function of depth before and after a proton bombardment step together with the profile of compensating centres which is required to account for the carrier removal during bombardment.

To demonstrate the obtainment of a narrow damage region by proton bombardment an experiment was carried out in which a silicon layer initially substantially uniformly doped with a donor element in a concentration of approximately $2.5 \times 10^{15}$ atoms/cm.$^3$ was subjected to bombardment with protons of 250 KeV energy whilst heating the layer at 800°C. The sample was contaminated with silver prior to bombardment. During bombardment the silver diffused into the damage region where it formed deep compensating levels and removed electrons. FIG. 2 shows the carrier concentration in atoms/cm.$^3$ as a function of depth from the surface in microns, the broken line A representing the donor concentration prior to bombardment and the line B representing the donor concentration after bombardment. The damage profile required to account for the carrier removal as indicated by line B is shown in curve C. From this curve it is seen that the damage profile is approximately Gaussian with a standard deviation $\sigma$ of approximately 1,700 A. In this case $x$ is approximately 2.40 microns and for such a layer in the form of an epitaxial layer on a more highly doped substrate and under such conditions of proton bombardment, a boundary which lies at depths varying between approximately 2.0 microns and 2.8 microns will be relocated at a substantially constant depth of 2.0 microns from the surface of the epitaxial layer.

As an example of the case shown in FIG. 1, consider bombardment of silicon with protons of 150 KeV energy. This gives a value $\sigma$ of approximately $0.2\mu$. Thus in the case, for example of an $n^+$-substrate having a less highly doped $n$-type epitaxial layer thereon, where the boundary lies at a mean depth corresponding to the depth of maximum damage, that is approximately 1.4 microns, then if the initial epitaxial layer thickness variation and hence the total boundary depth variation is not greater than $4\sigma = 0.8\mu$, the boundary will be relocated at a constant distance of approximately 1.0 micron from the surface.

Referring now to FIG. 3, an experiment was carried out to fully demonstrate the feasibility of the method in accordance with the invention. Initially a semiconductor substrate in form of a slice of 2.5 cm. diameter of $n^+$ silicon containing antimony as the donor impurity in a concentration of approximately $10^{19}$ atoms/cm$^3$ was provided with an n-type silicon epitaxial layer containing a substantially uniform concentration of approximately $10^{15}$ atoms/cm$^3$ of arsenic as the donor impurity. The composite body of the substrate and applied epitaxial layer was subjected to an etching treatment to bevel the epitaxial layer so that its thickness varied substantially uniformly across the body from a value of approximately 2 microns to a value of approximately 5 microns. The boundary depth, which approximates to the epitaxial layer thickness was measured electrically over various positions of the layer using a conventional Schottky barrier mercury probe technique and plotted as shown by the solid line A in FIG. 3 in which the boundary depth in microns measured from the epitaxial layer surface are plotted as ordinates and the distances across the slice in centimetres from the edge thereof are plotted as abscissae. The slight departure from linearity of the broken line A indicates that the bevelled surface of the epitaxial layer is not quite flat. The semiconductor body was then subjected to bombardment with protons of 350KeV energy which were directed at the bevelled surface in the direction approximately normal to the boundary. During this bombardment the silicon body was maintained at a temperature of 800°C.

Subsequent to the bombardment the boundary depth was again measured over various positions of the layer using a conventional Schottky barrier mercury probe technique and plotted as shown by the solid line B in FIG. 2. From the line B it is seen that over that part of the body where the boundary previously was situated between approximately 3.1 microns and 4 microns from the surface the effect of the proton bombardment and enhanced diffusion of antimony from the substrate into the damaged sites produced in the epitaxial layer is to re-locate the boundary closer to the surface of the epitaxial layer at a substantially constant distance from the surface as indicated by the near linear portion of the line B extending substantially parallel to the horizontal axis.

This demonstrates that for a non-bevelled body having an epitaxial layer of varying thickness such that the boundary lies in the range of approximately 3.1 microns to 4 microns this boundary may be re-located at a substantially constant depth from the surface by a proton bombardment and heating step under the same conditions. Similarly by appropriate choice of the energy of the proton beam and heating temperature epitaxial layers of other mean thicknesses may be treated to give a uniform boundary depth.

An embodiment of the method in accordance with the invention will now be described with reference to FIGS. 4 and 5. A semiconductor substrate 1 in the form of a slice of $n^+$ silicon of 0.001 ohm/cm. resistivity containing antimony as the donor impurity, 3.2 cm. diameter, 250 micron thickness and <111> orientation, is provided having a flat surface by conventional techniques. On the surface of the substrate there is grown an epitaxial layer 2 of n-type silicon by a conventional epitaxial deposition process. The epitaxial layer has a doping $10^{15}$ atoms/cm$^3$ of arsenic and a mean thickness of 3.5 microns, the thickness of said layer varying between 3.1 and 3.9 microns. The metallurgical interface between the substrate 1 and the layer 2 is shown by the line 3 and the boundary between the epitaxial layer 2 and the more highly doped underlying region comprising substrate impurity is shown by the broken line 4 extending in the epitaxial layer material 2 and slightly spaced from the metallurgical interface 3. The location of the boundary 4 as hereinbefore defined is the position in the layer where the donor impurity concentration is 10 times the background concentration in the layer, that is $10^{16}$ atoms/cm$^3$.

It is clear that the surface 5 of the epitaxial layer lies at a varying distance from the metallurgical interface 3 and it is such a thickness variation of the epitaxial layer which has hitherto given rise to spread of device characteristics in a plurality of devices formed from the single silicon body 1, 2.

The silicon body 1, 2 is then placed in the target chamber of a proton apparatus and by a scanning method the whole surface 5 is subjected to proton bombardment having an energy of 350KeV while heating the body at 800°C. The dose is $10^{17}$/sq. cm. The effect of the proton bombardment is to cause damage to the internal crystal structure at a location below the surface 5 of the epitaxial layer 2 and having a distribution of approximately Gaussian form as is illustrated in FIG. 1. The mean range of the protons of the said energy is approximately 3.5 microns and substantial damage occurs over a controlled distance from the surface which lies at a depth between 3.1 microns and 3.9 microns. At the heating temperature of 800°C enhanced diffusion of antimony atoms occurs from the more highly doped substrate 1 into the damaged sites created in the lower doped epitaxial layer 2. Diffusion is effectively limited to the location of the said controlled range and hence the boundary of said diffusion of antimony lies at a constant distance of approximately 3.1 microns from all parts of the surface 5. This boundary is shown in FIG. 5 by the broken line 6 and lies substantially parallel to the surface 5. Again the location of the re-located boundary 6 is at positions where the donor impurity concentration in the layer material is $10^{16}$ atoms/cm$^3$. Due to the damage being produced sufficiently close to all parts of the original boundary in the vicinity of the metallurgical interface to permit enhanced diffusion of antimony across all parts of the original boundary the re-located boundary 6 everywhere lies wholly in the epitaxial layer spaced from the metallurgical interface and this additionally is a factor for improving the performance of the devices subsequently manufactured from the semiconductor body shown in FIG. 5.

A further embodiment of a method in accordance with the invention will now be described. In this method a silicon slice having dimensions corresponding substantially to those of the slice in the preceding embodiment but having a donor concentration of arsenic of $5 \times 10^{19}$ atoms/cm$^3$ substrate is provided within a thin n-type epitaxial layer containing phosphorus in a substantially uniform concentration of $10^{15}$ atoms/cm$^3$. The layer is of 1.5 microns average thickness and has a thickness variation of $\pm 0.2\mu$. In this embodiment the proton bombardment is carried out with protons of 150KeV energy and the silicon body is heated at 900°C during the bombardment. This re-locates the boundary at a substantially constant distance of approximately 1.0 micron from all parts of the epitaxial layer surface.

What we claim is:

1. A method of manufacturing an epitaxial semiconductor wafer comprising epitaxially growing on the surface of an impurity-doped portion of a semiconductor substrate an epitaxial layer of substantially uniform doping whose doping level is lower than that of the substrate portion, said epitaxial growth possibly resulting in an epitaxial layer of variable thickness with the result that the layer surface is non-uniformly spaced from the boundary between the different doping levels in the substrate portion and layer, thereafter subjecting the whole wafer to bombardment with a beam of energetic particles which are incident at or adjacent the surface of the layer and are directed towards the boundary between the layer and the substrate, the bombardment being effected under conditions to cause internal damage of the crystal structure in the epitaxial layer adjacent the boundary over a controlled distance which extends between the vicinity of the boundary and a substantially constant depth from all parts of the surface of the layer, and maintaining the semiconductor body at a suitable elevated temperature during said bombardment to produce an enhanced out-diffusion of substrate impurities into the layer until the boundary between the layer material and the underlying more highly doped region containing out-diffused substrate impurity is relocated at positions in the layer which are at a substantially constant depth from all parts of the layer surface.

2. A method as claimed in claim 1, wherein the substrate portion has a substantially flat surface, and the energy of the energetic particles is chosen such that the mean range in the material of the semiconductor layer substantially coincides with the average thickness of the layer.

3. A method as claimed in claim 2, wherein the epitaxial layer surface is not masked during the bombardment step.

4. A method as claimed in claim 2, wherein the enhanced out-diffusion is limited to the region of the damaged crystal structure.

5. A method as claimed in claim 1, wherein the depth of the relocated boundary is at most 1 micron from the surface.

6. A method as claimed in claim 1, wherein the energetic particles are protons, and during the bombardment step the wafer is heated to a temperature in the range of 500°C to 900°C.

7. A method as claimed in claim 1, wherein a plurality of semiconductor substrates are each provided with an epitaxial layer of substantially uniform doping by substantially similar processing, and thereafter at least some of said plurality of substrates with applied epitaxial layers are subjected to the said bombardment step to produce a plurality of semiconductor wafers in which in the epitaxial layers the boundaries between the layer material of substantially uniform doping and the underlying more highly doped region containing substrate impurity are all situated at substantially the same constant depth from the epitaxial layer surface.

* * * * *